United States Patent
Wang et al.

(10) Patent No.: US 10,859,905 B2
(45) Date of Patent: Dec. 8, 2020

(54) PHOTOMASK AND METHOD FOR FORMING THE SAME

(71) Applicant: TAIWAN SEMICONDUCTOR MANUFACTURING COMPANY LTD., Hsinchu (TW)

(72) Inventors: Hsuan-Wen Wang, Kaohsiung (TW); Hao-Ming Chang, Pingtung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 206 days.

(21) Appl. No.: 16/134,339

(22) Filed: Sep. 18, 2018

(65) Prior Publication Data
US 2020/0089098 A1    Mar. 19, 2020

(51) Int. Cl.
| | | |
|---|---|---|
| *G03F 1/36* | (2012.01) | |
| *G03F 1/72* | (2012.01) | |
| *G03F 1/60* | (2012.01) | |
| *G03F 1/26* | (2012.01) | |

(52) U.S. Cl.
CPC .................. *G03F 1/36* (2013.01); *G03F 1/26* (2013.01); *G03F 1/60* (2013.01); *G03F 1/72* (2013.01)

(58) Field of Classification Search
CPC ..... G03F 1/36; G03F 1/72; G03F 1/60; G03F 1/26; G03F 1/80; G03F 1/48
See application file for complete search history.

(56) References Cited

U.S. PATENT DOCUMENTS

| | | |
|---|---|---|
| 5,830,332 A | 11/1998 | Babich et al. |
| 9,952,501 B2 | 4/2018 | Fukaya et al. |
| 2003/0228529 A1 | 12/2003 | Dieu et al. |
| 2004/0137335 A1 | 7/2004 | Cummings |
| 2005/0053847 A1 | 3/2005 | Martin et al. |
| 2006/0134534 A1 | 6/2006 | Dieu et al. |
| 2016/0109797 A1 | 4/2016 | Tanabe |
| 2018/0164675 A1* | 6/2018 | Chang ........................ G03F 1/32 |
| 2020/0054726 A1 | 2/2020 | Nozawa et al. |

FOREIGN PATENT DOCUMENTS

| | | |
|---|---|---|
| JP | 2018-45133 | 3/2018 |
| KR | 2017-0034327 | 3/2017 |
| TW | 200842492 | 11/2008 |

(Continued)

OTHER PUBLICATIONS

Wen Lin, Howard Huff, Silicon Materials, Handbook of Semiconductor Manufacturing Technology, (2007) 3-1 to 3-78.

(Continued)

*Primary Examiner* — Stewart A Fraser
(74) *Attorney, Agent, or Firm* — WPAT, P.C., Intellectual Property Attorneys; Anthony King

(57) ABSTRACT

A method for forming a photomask includes receiving a mask substrate including a protecting layer and a shielding layer formed thereon, removing portions of the shielding layer to form a patterned shielding layer, and providing a BSE detector to monitor the removing of the portions of the shielding layer. When a difference in BSE intensities obtained from the BSE detector is greater than approximately 30%, the removing of the portions of the shielding layer is stopped. The BSE intensity in following etching loops becomes stable.

20 Claims, 17 Drawing Sheets

(56) References Cited

FOREIGN PATENT DOCUMENTS

| TW | 201708931 | 3/2017 |
|---|---|---|
| TW | 201830123 | 8/2018 |

OTHER PUBLICATIONS

Office Action and Search Report dated Jun. 24, 2020 issued by Taiwan Intellectual Property Office for counterpart application No. 108125862.
English Abstract Translation of Foreign Reference JP2018045133.
English Abstract Translation of Foreign Reference TW200842492.
U.S. Pat. No. 9,952,501 is the corresponding application for Foreign Reference KR2017-0034327.
US Patent Publication 20200054726 is the corresponding application for Foreign Reference TW201708931.
US Patent Publication 20180164675 is the corresponding application for Foreign Reference TW201830123.

* cited by examiner

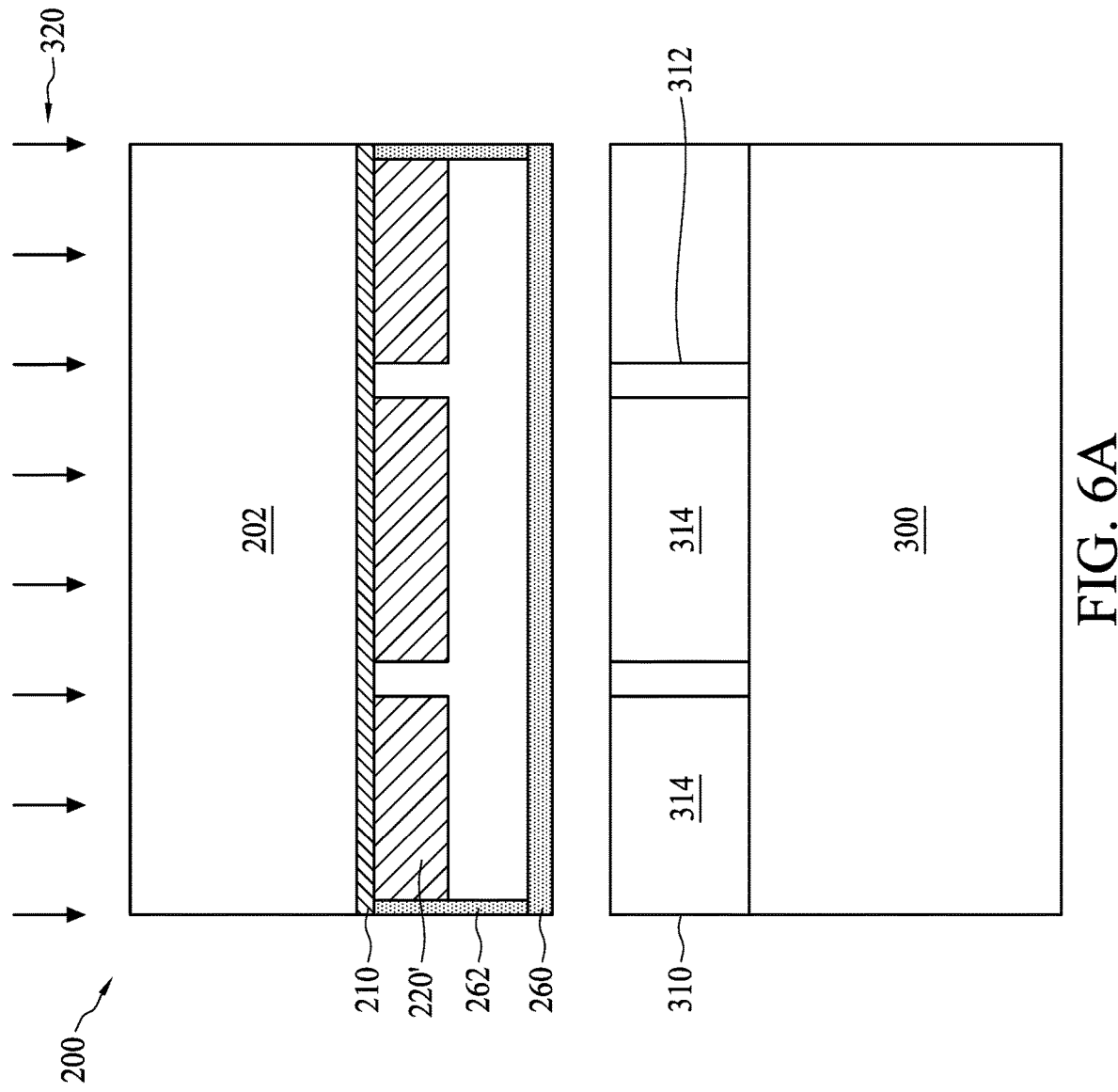

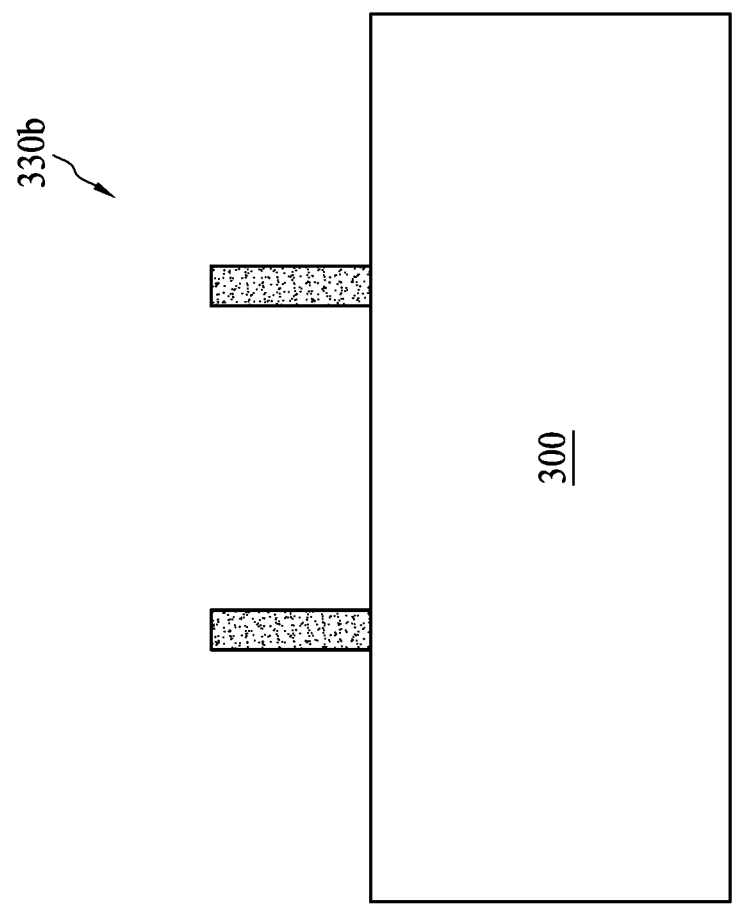

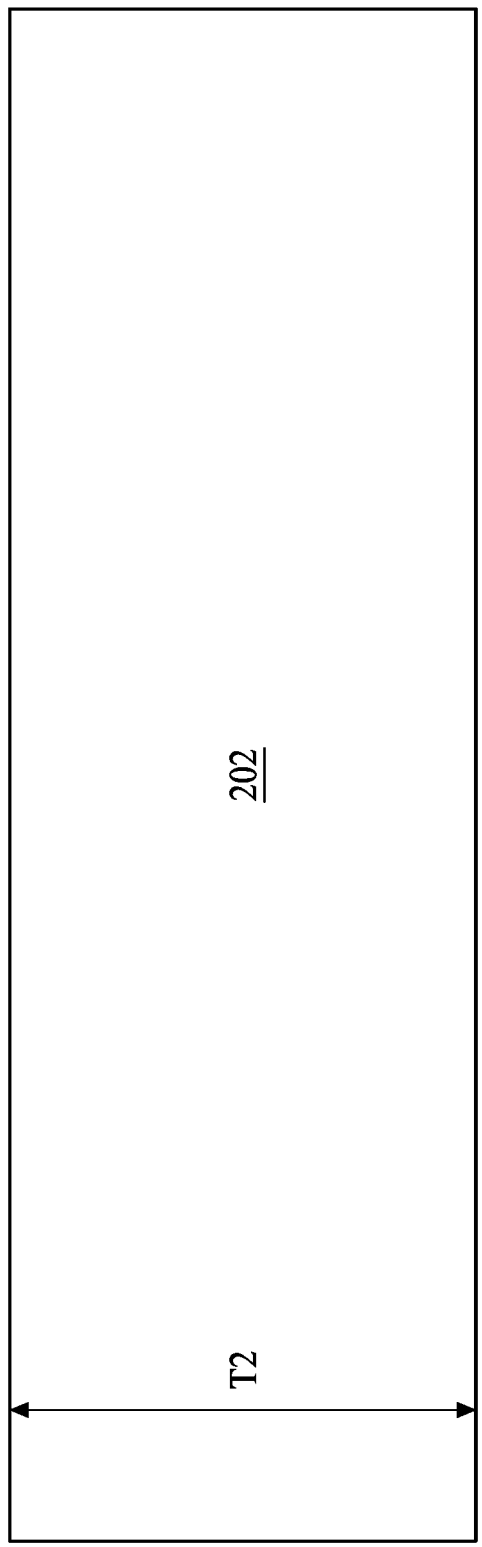

PHOTOMASK AND METHOD FOR FORMING THE SAME

BACKGROUND

The semiconductor integrated circuit industry has experienced rapid growth in the past several decades. Technological advances in semiconductor materials and design have produced continuously smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Semiconductor fabrication relies heavily on the process of photolithography, in which light of a given frequency is used to transfer a desired pattern onto a wafer undergoing semiconductor processing. To transfer the pattern onto the wafer, a photomask (also referred to as a mask or reticle) is often used. The photomask permits and prevents light in a desired pattern onto a layer of the wafer, such as a photoresist (PR) layer, which chemically reacts to the light exposure, removing some portions of the PR and leaving other portions. The remaining PR is then used to pattern an underlying layer. As feature sizes have decreased, the wavelength of light used in photolithography to pattern layers has decreased as well, creating additional difficulties and necessitating technological advances such as the use of extreme ultraviolet (EUV) as a light source and also phase-shifting masks. Improving photomasks is important to facilitate continuing advances in the industry, because various kinds of imperfections or problems in the patterned layer can be compounded during subsequent processing steps in the processes of manufacturing semiconductor devices and integrated circuits. Photomask improvements, including improvements made to the mask blank on which the photomask is derived and patterning the photomask, are therefore required.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 6A to 6C are schematic drawings illustrating a semiconductor structure at various fabrication stages constructed according to aspects of the present disclosure in one or more embodiments.

FIGS. 7A to 7E are schematic drawings illustrating a mask substrate at various fabrication stages constructed according to aspects of the present disclosure in one or more embodiments.

DETAILED DESCRIPTION

Figure 1:
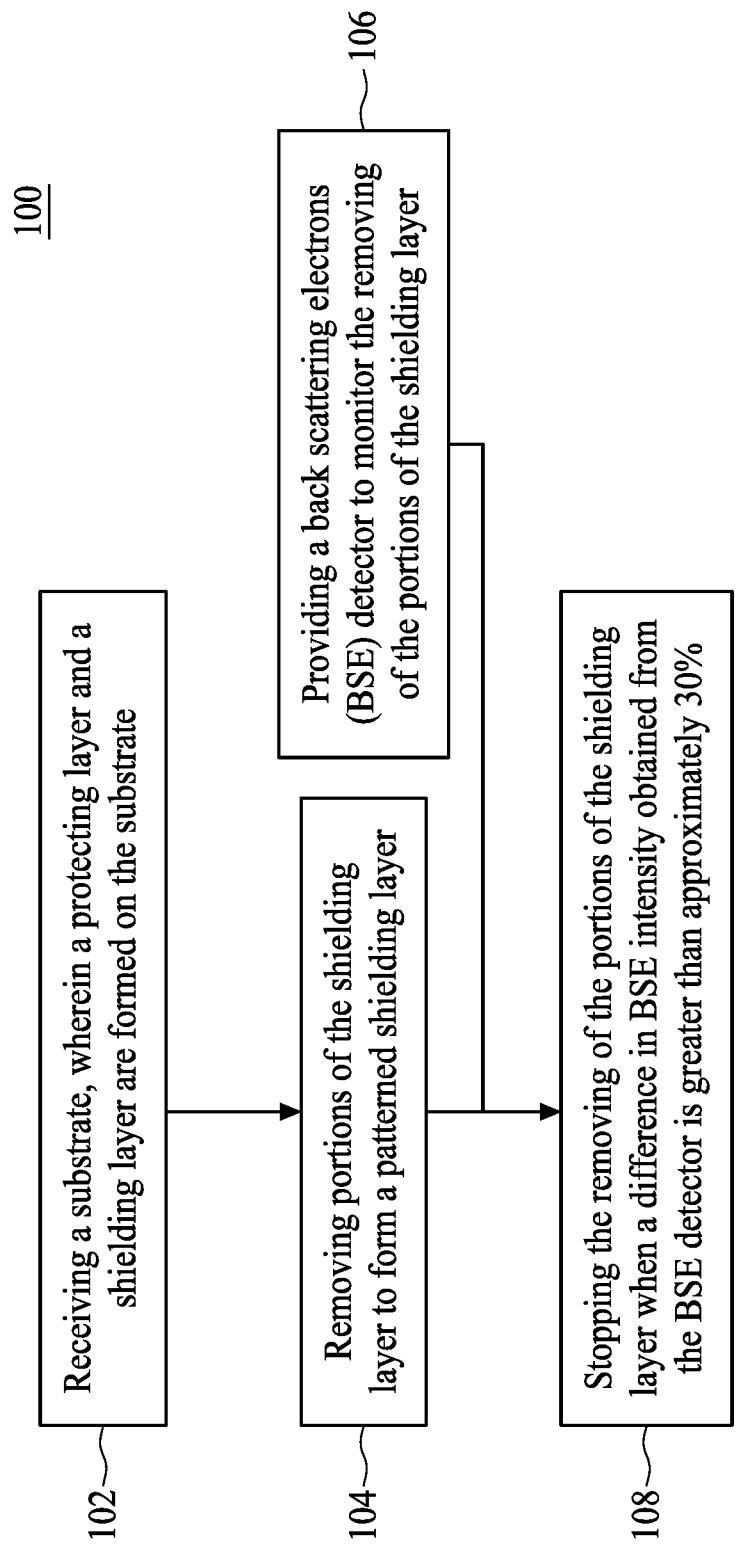
FIG. 1 is a flowchart representing a method for forming a photomask according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range can be contemplated by people having ordinary skill in the art. Alternatively, the terms "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As used in herein, properties such as flatness, surface roughness, and thickness uniformity may be used herein to describe layers and their surfaces. Flatness may be measured by using a reference horizontal plane based on the lowest point of the surface, and a lowest point reference (LPR) flatness may be calculated as the distance from the highest point of the surface to the reference horizontal plane. Surface roughness of a surface may be measured by the root mean square (RMS) of roughness-component irregularities from a mean line of the surface, which is also referred to as a surface RMS roughness. Thickness uniformity of a layer may be measured by the difference between the maximum and minimum values of thickness of the layer, which is also referred to as a total thickness variation (TTV). It is noted that these measurements are exemplary only and not intended to be limiting beyond what is specifically recited in the claims that follow. For example, other ways of measuring flatness, surface roughness, and thickness uniformity would be recognized by one of ordinary skill in the art.

A typical fabrication operation for a photomask may include imaging a circuit pattern into a resist layer formed on a mask substrate (also referred to as mask blank), developing the resist layer, etching the resist layer, transferring the circuit pattern from the resist layer to an opaque or semitransmissive layer. In some embodiments, a plasma bombardment is used to etch the opaque or semitransmissive layer. It is found that in some embodiments, the mask substrate is over-etched by the plasma bombardment during the etching of the opaque or semitransmissive layer; therefore a plurality of recesses are formed over a surface of the mask substrate. Those recesses are referred to as globalized over-etching defects. In some embodiments, a deviation between the surface of the mask substrate and a bottom surface of the recesses is greater than 4 nm. That is, flatness and thickness uniformity of the mask substrate are reduced.

Further, during the etching of the opaque or semitransmissive layer, defects may be created if portions of the opaque or semitransmissive layer remain on the mask substrate in areas that should be free of the opaque or semitransmissive layer. To remove such defects, a repair or a trimming operation is performed to remove the remnant opaque or semitransmissive layer from those areas. In some embodiments, a local etching such as a laser beam etching is used. It is found that in some embodiments, the mask substrate is also etched during the etching of the remnant opaque or semitransmissive layer by the laser beam, and thus some of the recesses formed by the plasma bombardment are deepened by the local etching. The local etching not only deepens the recesses formed by the plasma bombardment, but also forms a rough bottom surface of the recesses. Those recesses and the rough bottom surface are referred to as localized defects. In some embodiments, a deviation caused by the localized defects may be greater than 8 nm. Accordingly, the globalized over-etching defects and the localized defects together cause reductions of the flatness and the thickness uniformity, as well as an increase of the surface roughness. It should be noted that to deal with such demands for miniaturization and increases in NA, greater flatness of the photomask is required. When the flatness of the photomask is reduced, a focused position of an image point on a wafer transferred through a projection lens fluctuates. To reduce adverse influence from the photomask having the globalized and localized defects, it is necessary to make time-consuming and complicated adjustments in order to focus the projection lens or to adjust the energy used in an exposure.

On the other hand, recycling of the mask substrate is now a general accepted idea, since the increased demand of silicon wafer has raised market prices. In some embodiments, the opaque or semitransmissive layer including the circuit pattern is stripped, such that the re-using of a mask substrate can be an effective way to cut cost compared to purchasing a new mask substrate. Further, the mask substrates can be used for other applications such as LED, bio-chip, decorating glasses, and the like. In addition, the reuse of the mask substrate reduces use of scarce natural resources necessary to produce a new one. However, the abovementioned globalized and localized defects do result in extra effort during the recycling of the mask substrate. In some embodiments, to remove the globalized and localized defects, a polishing operation is performed to produce a flat surface of a mask substrate.

The present disclosure therefore provides a photomask, a method for forming a photomask and a method for treating a mask substrate. In some embodiments, a protecting layer is formed on the mask substrate to provide protection to the mask substrate, and thus the abovementioned globalized and localized defects are reduced. Accordingly, flatness of the mask substrate is improved. Further, since the globalized and localized defects are reduced, a polishing operation is no longer necessary during the recycling operation of the mask substrate. In some embodiments, operations for forming the photomask and operations for recycling the mask substrate are both simplified.

It should be noted that in some embodiments, the terms "photomask," "mask" and "reticle" are used to refer to the same item. In some embodiments, the photomask can be a reflective mask such as that described in further detail below. In some embodiments, the photomask may incorporate other resolution-enhancement features, such as features of a phase-shifting mask (PSM) or optical proximity correction (OPC).

FIG. 1 is a flowchart of a method 100 for forming a photomask. The method 100 includes an operation 102, receiving a substrate. A protecting layer and a shielding layer are formed on the substrate. The method 100 further includes an operation 104, removing portions of the shielding layer to form a patterned shielding layer. The method 100 further includes an operation 106, providing a back scattering electron (BSE) detector to monitor the removing of the portions of the shielding layer. The method 100 further includes an operation 108, stopping the removing of the portions of the shielding layer when a difference in BSE intensities obtained from the BSE detector is greater than approximately 30%. The method 100 will be further described according to one or more embodiments. It should be noted that the operations of the method 100 may be rearranged or otherwise modified within the scope of the various aspects. It should be further noted that additional processes may be provided before, during, and after the method 100, and that some other processes may be only briefly described herein. Thus, other implementations are possible within the scope of the various aspects described herein.

Figure 2:
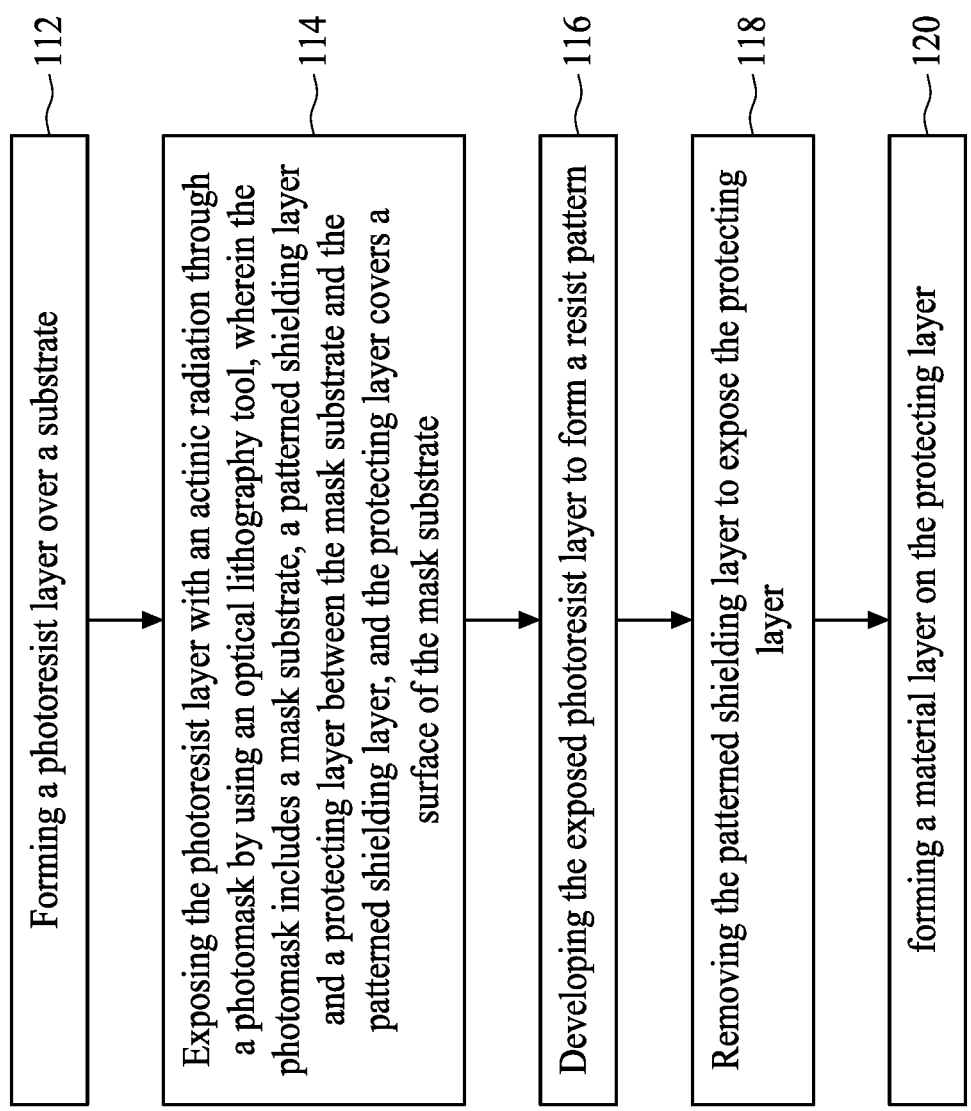
FIG. 2 is a flowchart representing a method for treating a mask substrate according to aspects of the present disclosure.

FIG. 2 is a flowchart of a method 110 for forming a semiconductor structure. The method 110 includes an operation 112, forming a photoresist layer over a substrate. The method 110 includes an operation 114, exposing the photoresist layer with an actinic radiation through a photomask by using an optical lithography tool. In some embodiments, the photomask includes a mask substrate, a patterned shielding layer and a protecting layer between the mask substrate and the patterned shielding layer. In some embodiments, the protecting layer covers a surface of the mask substrate. The method 110 further includes an operation 116, developing the exposed photoresist layer to form a resist pattern. The method 110 further includes an operation 118, removing the patterned shielding layer to expose the protecting layer. The method 110 further includes an operation 120, forming a material layer on the protecting layer. The mask substrate includes a first thickness before the removing of the patterned shielding layer and a second thickness after the forming of the material layer. In some embodiments, the first thickness and the second thickness are the same. The method 110 will be further described according to one or more embodiments. It should be noted that the operations of the method 110 may be rearranged or otherwise modified within the scope of the various aspects. It should be further noted that additional processes may be provided before, during, and after the method 110, and that some other processes may be only briefly described herein. Thus, other implementations are possible within the scope of the various aspects described herein.

Figure 3A:
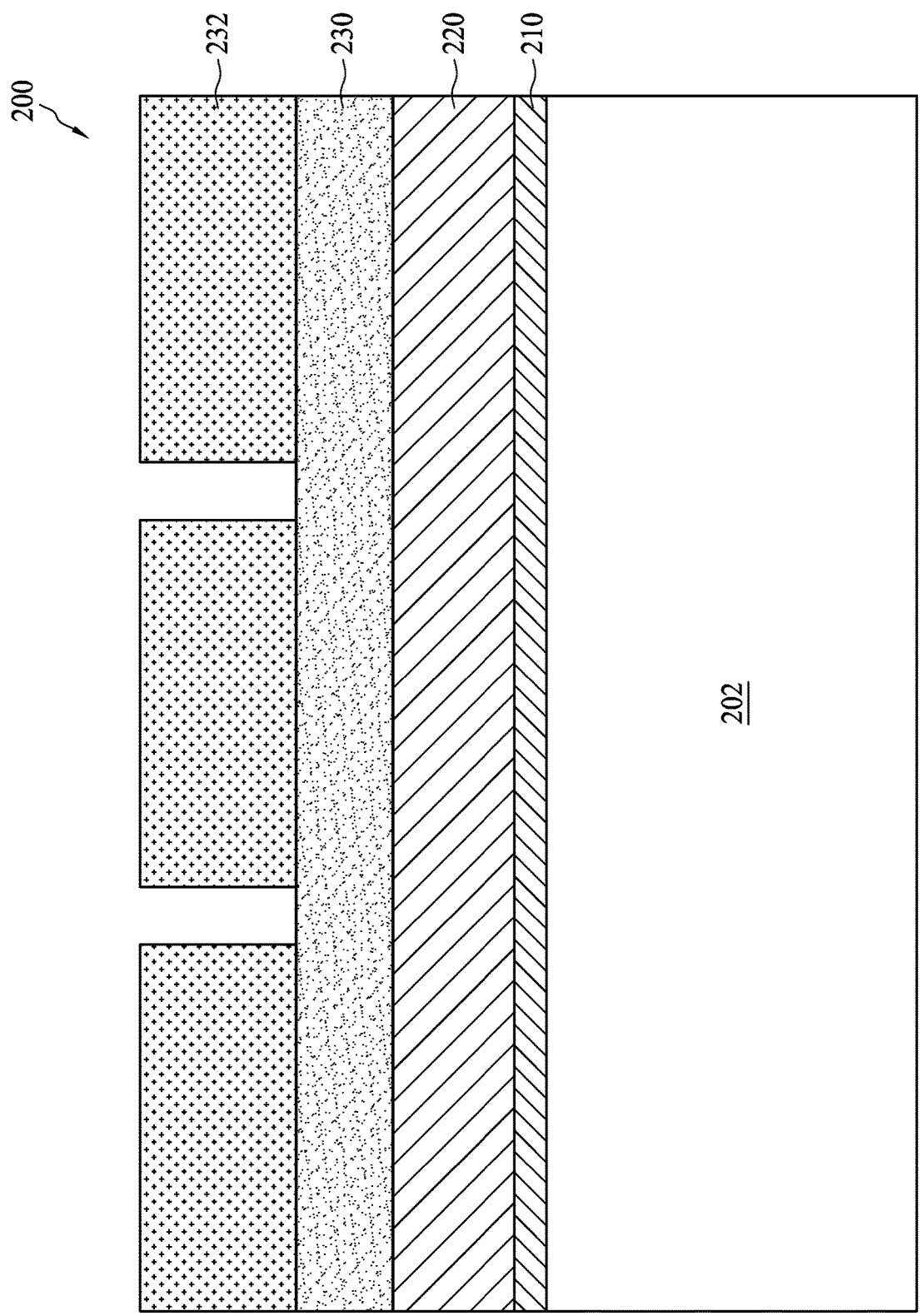
FIGS. 3A to 3E are schematic drawings illustrating a photomask at various fabrication stages constructed according to aspects of the present disclosure in one or more embodiments.

FIGS. 3A to 3E are schematic drawings illustrating a photomask at various fabrication stages constructed according to aspects of the present disclosure in one or more embodiments. As shown in FIG. 3A, a substrate 202 is received or provided according to operation 102. In some embodiments, the substrate 202 is a mask substrate that includes low thermal expansion material (LTEM) serving to minimize image distortion due to mask heating induced by intensified illumination radiation. In some embodiments, the LTEM may include silicon, quartz, fused silica, fused quartz, calcium fluoride (CaF), silicon carbide (SiC), silicon oxide-titanium oxide, and/or other suitable LTEM known in the art. Further, the mask substrate 202 may include materials with a low defect level and a smooth surface.

Still referring to FIG. 3A, a first layer such as a protecting layer 210 is formed on the mask substrate 202 and covers a surface of the mask substrate 202. In some embodiments, the protecting layer 210 entirely covers the surface of the mask substrate 202. Further, a second layer such as a shielding layer 220 is formed on the protecting layer 210. The protecting layer 210 includes materials that are optically transparent at a wavelength of, for example but not limited thereto, approximately 193 nm, and have a high band gap. For example, a band gap of the materials used in the protecting layer 210 is equal to or greater than 6.4 eV, but the disclosure is not limited thereto. The protecting layer 210 is more resistant to a halogen-based gas than the mask substrate 202. The protecting layer 210 includes metal fluoride. In some embodiments, the protecting layer 210 can include magnesium fluoride ($Mg_{X1}F_{Y1}$), aluminum fluoride ($Al_{X2}F_{Y2}$), lanthanum fluoride ($La_{X3}F_{Y3}$), or gadolinium fluoride ($Gd_{X4}F_{Y4}$), but the disclosure is not limited thereto. In some embodiments, X1, X2, X3 and X4 can be positive integer, and Y1, Y2, Y3 and Y4 can be positive integer. In some embodiments, X1 can be 1 and Y1 can be 2, in other word, $MgF_2$ can be a potential material used herein, but the disclosure is not limited thereto. In some embodiments, X2 can be 1 and Y2 can be 3, in other word, $AlF_3$ can be a potential material used herein, but the disclosure is not limited thereto. In some embodiments, X3 can be 1 and Y3 can be 3, in other word, $LaF_3$ can be a potential material used herein, but the disclosure is not limited thereto. In some embodiments, X4 can be 1 and Y4 can be 3, in other word, $GdF_3$ can be a potential material used herein, but the disclosure is not limited thereto. It should be noted that the metal fluoride used to form the protecting layer 210 is selected depending on the material used to form the shielding layer 220, which will be described in detail below.

An extinction coefficient (k) is defined herein as the fraction of light lost to scattering and absorption per unit distance in a participating medium. It should be noted that extinction coefficient (k) of $MgF_2$ is less than about $10^{-4}$, extinction coefficient of $AlF_3$ is less than about $10^{-3}$, extinction coefficient of $LaF_3$ is less than about $2*10^{-2}$, and extinction coefficient of $GdF_3$ is less than about $10^{-3}$. Further, refractive index (n) of $MgF_3$ is approximately 1.42, refractive index of $AlF_3$ is approximately 1.4, refractive index of $LaF_3$ is equal to or greater than approximately 1.85, and refractive index of $GdF_3$ is approximately 1.58. Accordingly, it should be noted that the protecting layer 210 includes materials that are optically transparent. In some embodiments, when the protecting layer 210 is used in an exposure with light having a wavelength less than 365 nm (i.e., 365 nm, 248 nm, or 193 nm), as long as a transmittance of the protecting layer 210 is greater than 0.9, a thickness of the protecting layer 210 can be between approximately 1 nm to approximately 1000 nm. In some embodiments, the thickness of the protecting layer 210 is related to the wavelength of light used in the exposure, the refractive index of the protecting layer 210, and the extinction coefficient of the protecting layer 210. Further, the thickness of the protecting layer 210 can be calculated according to different equalizations, depending on the thickness range. For example, in some embodiments, when the thickness of the protecting layer 210 is assumed to be greater than 100 nm, the thickness can be determined by the equalization (1) and (2):

$$T = (1-R)e^{-4k\pi d/\lambda} \quad (1)$$

$$R = \frac{(n-1)^2 + k^2}{(n+1)^2 + k^2} \quad (2)$$

Wherein T indicates the transmittance of the protecting layer 210, R indicates the reflectance of the protecting layer 210, n indicates the refractive index of the protecting layer 210, k indicates the extinction coefficient of the protecting layer 210, λ indicates the wavelength of the light used in the exposure, and d indicates the thickness of the protecting layer 210. In some embodiments, the extinction coefficient can be ignored because it is less than $10^{-4}$, but the disclosure is not limited thereto.

In some embodiments, when the thickness of the protecting layer 210 is assumed to be between 1 nm and 100 nm, the thickness can be determined by the equalization (3) to (5):

$$T = \frac{1}{\frac{1}{1-R} + \frac{1}{T_s} - 1} \quad (3)$$

$$R = \frac{\left[n_0\left(\cos\theta - \frac{1}{n}k_s\sin\theta\right) - n_s\cos\theta\right]^2 +}{\left[n_0\frac{n_s}{n}\sin\theta - n\sin\theta + k_s\cos\right]^2} \qquad (4)$$

$$\theta = \frac{2\pi}{\lambda}nd \qquad (5)$$

Wherein $T_s$ indicates the transmittance of the mask substrate 202, T indicates the transmittance of the protecting layer 210, R indicates the reflectance of the protecting layer 210, $n_0$ indicates the refractive index of medium used in the exposure, $n_s$ indicates the refractive index of the mask substrate 202, n indicates the refractive index of the protecting layer 210, $k_s$, indicates the extinction coefficient of the mask substrate 202, θ indicates an incident angle of the light used in the exposure, λ indicates the wavelength of the light used in the exposure, and d indicates the thickness of the protecting layer 210. In some embodiments, the extinction coefficients $k_s$ can be ignored because it is less than $10^{-4}$, but the disclosure is not limited thereto.

In some embodiments, the thickness of the between approximately 1 nm and approximately 10 nm, but the disclosure is not limited thereto. In some embodiments, different material has different extreme value. For example, when thickness of the protecting layer 210 is less than 100 nm, a $AlF_3$ layer has greater transmittance when its thickness is approximately 35 nm, while a $LaF_3$ layer has greater transmittance when its thickness is approximately 1 nm or 57 nm.

Still referring to FIG. 3A, the shielding layer 220 is formed over the mask substrate 202 and separated from the mask substrate 202 by the protecting layer 220. In some embodiments, the shielding layer 220 includes chromium (Cr), chromium nitride (CrN), molybdenum-silicon-nitride (MoSiN), molybdenum silicide (MoSi), molybdenum silicon oxynitride (MoSiON), SiO or SiN, but disclosure is not limited to these materials. In some embodiments, the shielding layer 220 can be a single-layer structure. In other embodiments, the shielding layer 220 can be a multi-layer structure. In some embodiments, the shielding layer 220 includes MoSiN, MoSi or MoSiON, while the protecting layer 210 can include $MgF_2$, $AlF_3$, $LaF_3$, or $GdF_3$. In some embodiments, the shielding layer 220 includes SiO, SiN or silicon oxynitride (SiON), and the protecting layer 210 can include $LaF_3$ or $GdF_3$. It should be noted that the protecting layer 210 is also more resistant to a halogen-based gas than the shielding layer 220. The arrangements of the protecting layer 210 and the shielding layer 220 in various embodiments will be described below.

In some embodiments, a hard mask layer 230 can be formed on the shielding layer 220 as shown in FIG. 3A. The hard mask layer 230 can include materials suitable to reflect or absorb light as required by the operation for forming the photomask. The hard mask layer 230 can include Cr, CrN, chromium oxide (CrO), tantalum nitride (TaN), tantalum oxide (TaO) or tantalum oxynitride (TaON), but the disclosure is not limited thereto.

In some embodiments, a patterned photoresist 232 is formed on the hard mask layer 230 as shown in FIG. 3A. In some embodiments, a photoresist layer is formed on the hard mask layer 230 and initially subjected to an exposure operation to form an exposed photoresist layer. The exposed photoresist layer defines a circuit pattern to be subsequently formed in the underlying layers. Next, the exposed photoresist layer is baked and then developed to form the patterned photoresist layer 232 including a pattern corresponding to the circuit pattern.

Figure 3B:
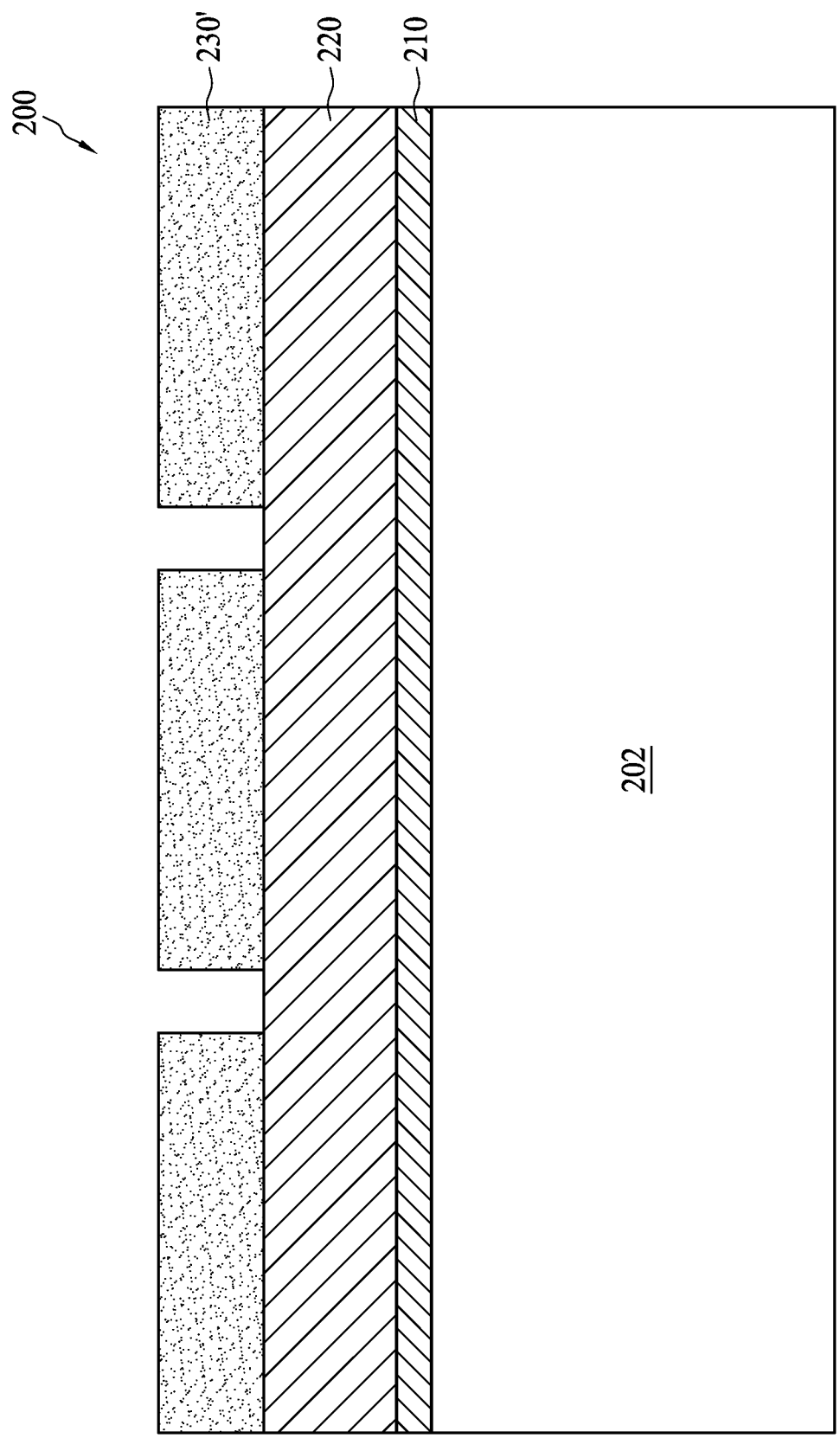

Referring to FIG. 3B, the hard mask layer 230 is subsequently etched through the patterned photoresist 232. In some embodiments, the hard mask layer 230 is subjected to a dry-etching operation, but the disclosure is not limited thereto. Thus, the pattern is transferred from the patterned photoresist layer 232 to the hard mask layer 230. Accordingly, a patterned mask layer 230' is formed on the shielding layer 220. After the forming of the patterned mask layer 230', the patterned photoresist layer 232 is stripped. In some embodiments, an after-etching inspection (AEI) can be performed and a clean operation can be subsequently performed.

Figure 3C:
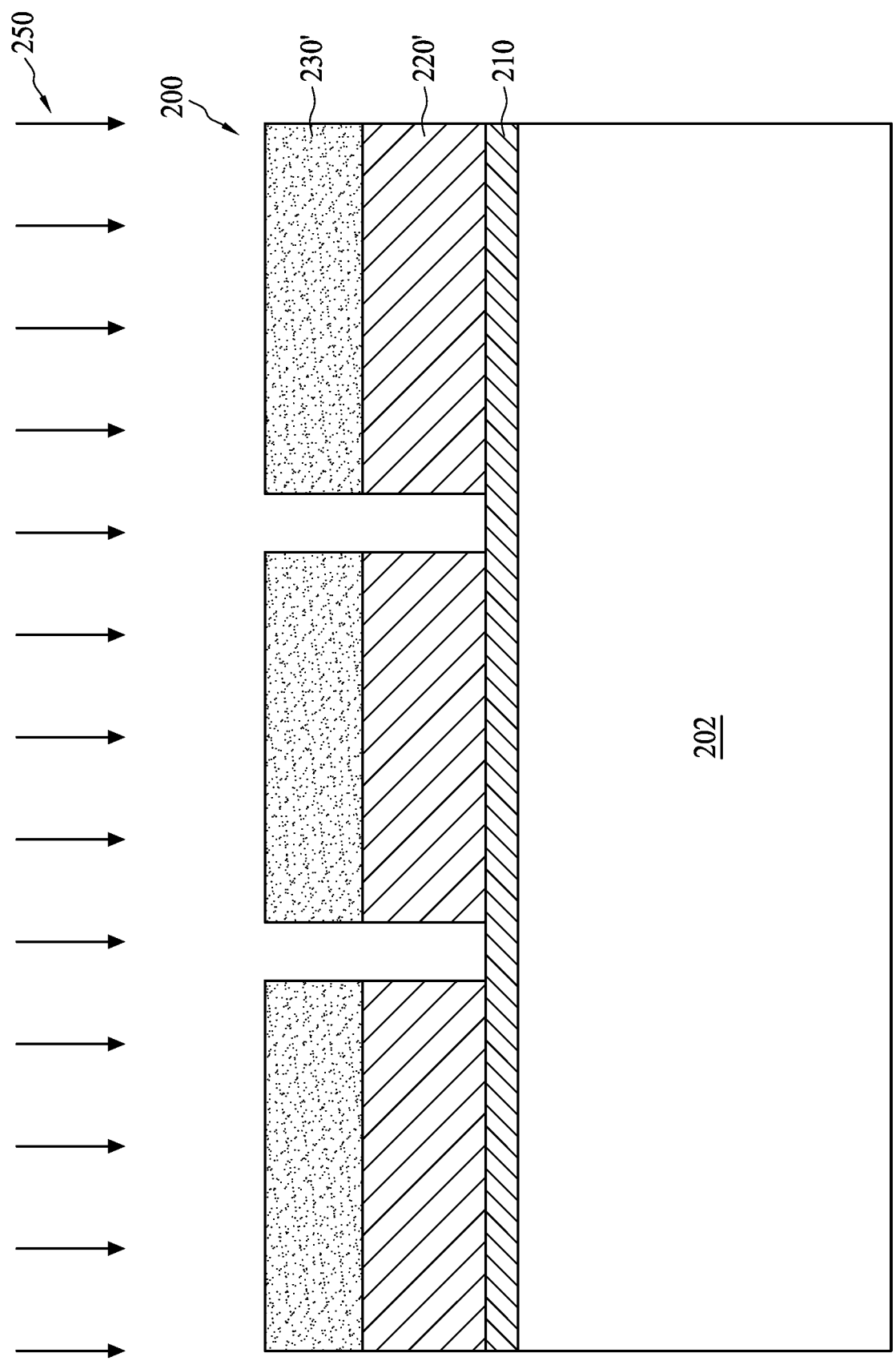

Referring to FIG. 3C, portions of the shielding layer 220 are then removed according to operation 104. In some embodiments, an etching 250 is performed to remove the portions of the shielding layer 220 through the patterned mask layer 230', as shown in FIG. 3C. In some embodiments, the etching 250 includes a laser beam etching or a plasma bombardment using a halogen-based gas. In some embodiments, the halogen-based gas includes, for example but not limited thereto, $Cl_2$, $F_2$, $CF_4$, $CCl_4$, HBr, HI, $CHF_3$, $SF_6$, $C_2F_6$, or HCl, etc. In some embodiments, fluorine-based gas such as, for example but not limited thereto, $F_2$, $CF_4$, $CHF_3$, $SF_6$ or $C_2F_6$, is used in the plasma bombardment, but the disclosure is not limited thereto. It should be noted that the protecting layer 210, which includes metal fluoride, is fluorine radical-resistant, and therefore the surface of the mask substrate 202 is protected by the protecting layer 210. Accordingly, the patterned shielding layer 220' including at least an opening is formed over the mask substrate 202.

In order to determine characteristics of the critical point, there should be a difference between signals detected from the mask substrate 202 and the shielding layer 210. Therefore, two kinds of sensors, such as an optical emission spectroscopy (OES) sensor and a back scattering electron (BSE) detector, are provided.

Figure 4:
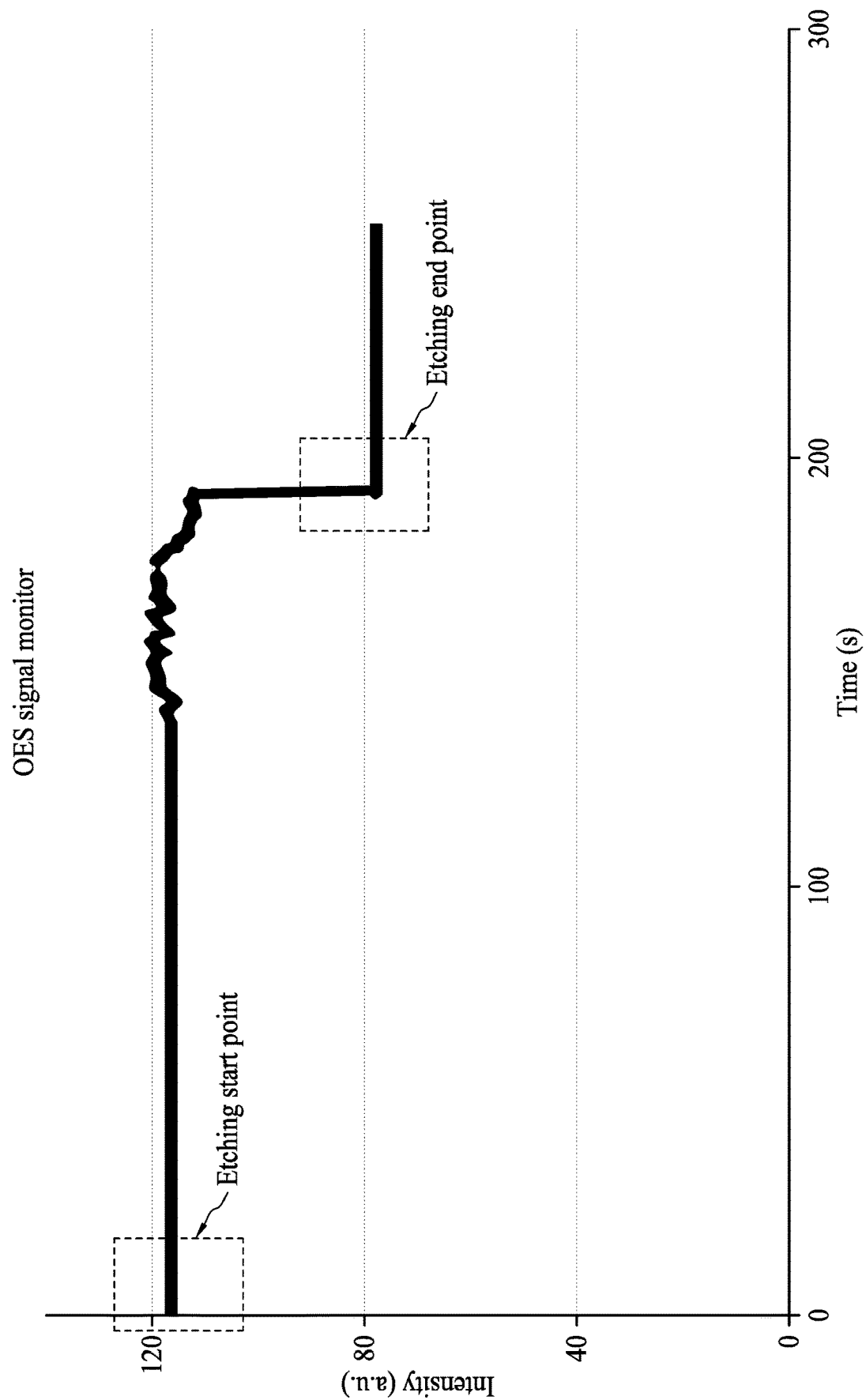
FIG. 4 is a chart showing measured signals obtained from an OES sensor.

In some embodiments, an OES sensor is provided to monitor the signal intensity of byproduct formed during the etching 250. Please refer to FIG. 4, which is a chart showing measured signals obtained from the OES sensor. It should be noted that during the etching 250, dynamic monitoring is required to control the film's etched height. In some embodiments, the etching 250 is controlled by a predetermined etching duration. That is, the etching 250 is stopped at the end of the predetermined etching duration, and the OES sensor is utilized during the predetermined etching duration. As shown in FIG. 4, deviation between signal intensity at the etching start point and signal intensity at the etching end point is observable, and the slope between the two signal intensities is observable. In some embodiments in which the protecting layer 210 is made of metal fluoride, and the shielding layer 220 is made of silicon nitride, when the protecting layer 210 is exposed during the etching process, byproducts are generated during the etching of the shielding layer 220. The byproducts are reduced greatly when the shielding layer 220 is removed. Accordingly, a deviation between the signal intensity of the shielding layer 220 and the signal intensity of the protecting layer 210 is different, and thus the deviation between signal intensity at the etching start point and signal intensity at the etching end point is observable, and the slope between the two signal intensities is approximately 90°. This indicates that the removal of the portions of the shielding layer 220 is completed and the etching stops at the protecting layer 210 without over-etching the mask substrate 202.

Figure 5:
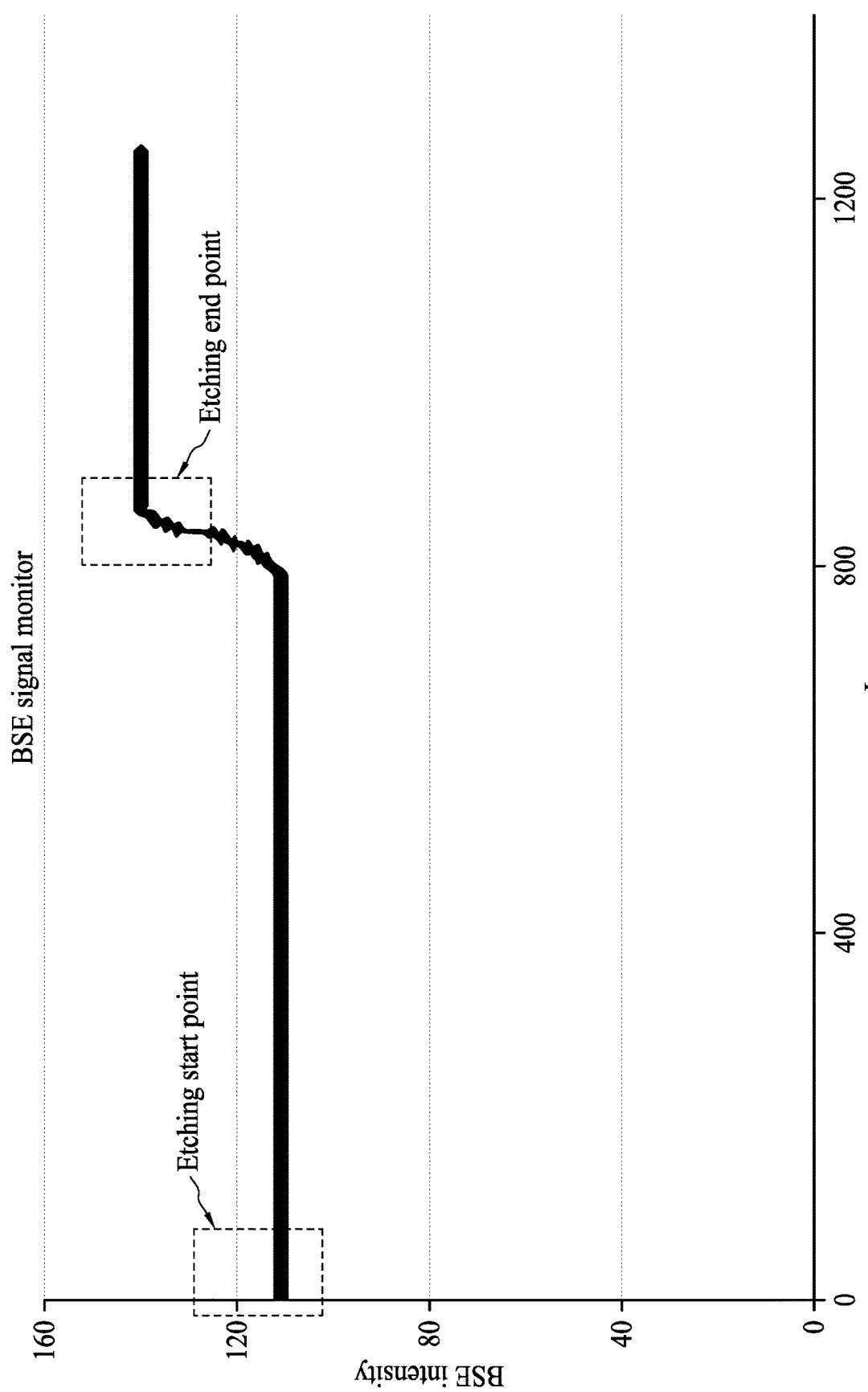
FIG. 5 is a chart showing measured signals obtained from a BSE sensor.

Please refer to FIGS. 1 and 5, which is a chart showing measured signals obtained from a BSE sensor. In some embodiments, the BSE detector is provided to monitor the removal of the portions of the shielding layer according to operation 106. An application of electron beam used in etching typically has various energy levels, such as in a range from 0.6 keV to 100 keV. An energy electron beam can strike an objective layer, producing back scattering electrons, and BSE signal intensity can be detected by the BSE detector. Normally, material that includes greater atomic sequences generates greater signal intensity, and contrast between different BSE signal intensities reveals that different materials are present. In some embodiments in which the protecting layer 210 is made of metal fluoride, and the shielding layer 220 is made of silicon nitride, since the difference between the effective atomic number of the metal fluoride and the effective atomic number of the silicon nitride is large, when a high BSE intensity value appears, as shown in FIG. 5, it can be concluded that the portions of the shielding layer 220 are completely removed and thus the protecting layer 210 is exposed during the etching operation. In some embodiments, when the difference in BSE intensity obtained from the BSE detector is greater than approximately 30%, and the BSE intensity in following etching loops becomes stable, the etching 250 for the removal of the portions of the shielding layer 220 can be automatically stopped or ended, according to operation 108.

It is found that when the shielding layer 220 includes MoSiN, MoSi or MoSiON, the difference between BSE intensity of the shielding layer 210 and that of the protecting layer 210 including $MgF_2$, $AlF_3$, $LaF_3$ or $GdF_3$ are greater than 30%, and thus the etching 250 can be automatically stopped or ended. However, it is also found that the difference between BSE intensity of the shielding layer 220 including SiO, SiN or SiON and the BSE intensity of the protecting layer 210 including $MgF_2$ or $AlF_3$ is between 10.4% and 10.6%, whereas the difference between the BSE intensity of the shielding layer 220 including SiO, SiN or SiON and BSE intensity of the protecting layer 210 including the $LaF_3$ or $GdF_3$ is greater than 50%. It should be noted that differences in BSE intensity that are less than 30% make it difficult to determine the etching end point. Therefore, in some embodiments, when the shielding layer 220 includes SiO, SiN or SiON, the protecting layer 210 including $LaF_3$ or $GdF_3$ is adapted. Accordingly, the etching 250 for the removal of the portions of the shielding layer 220 can be automatically stopped or ended when the difference in BSE intensities obtained from the BSE detector is greater than approximately 30%.

Figure 3D:
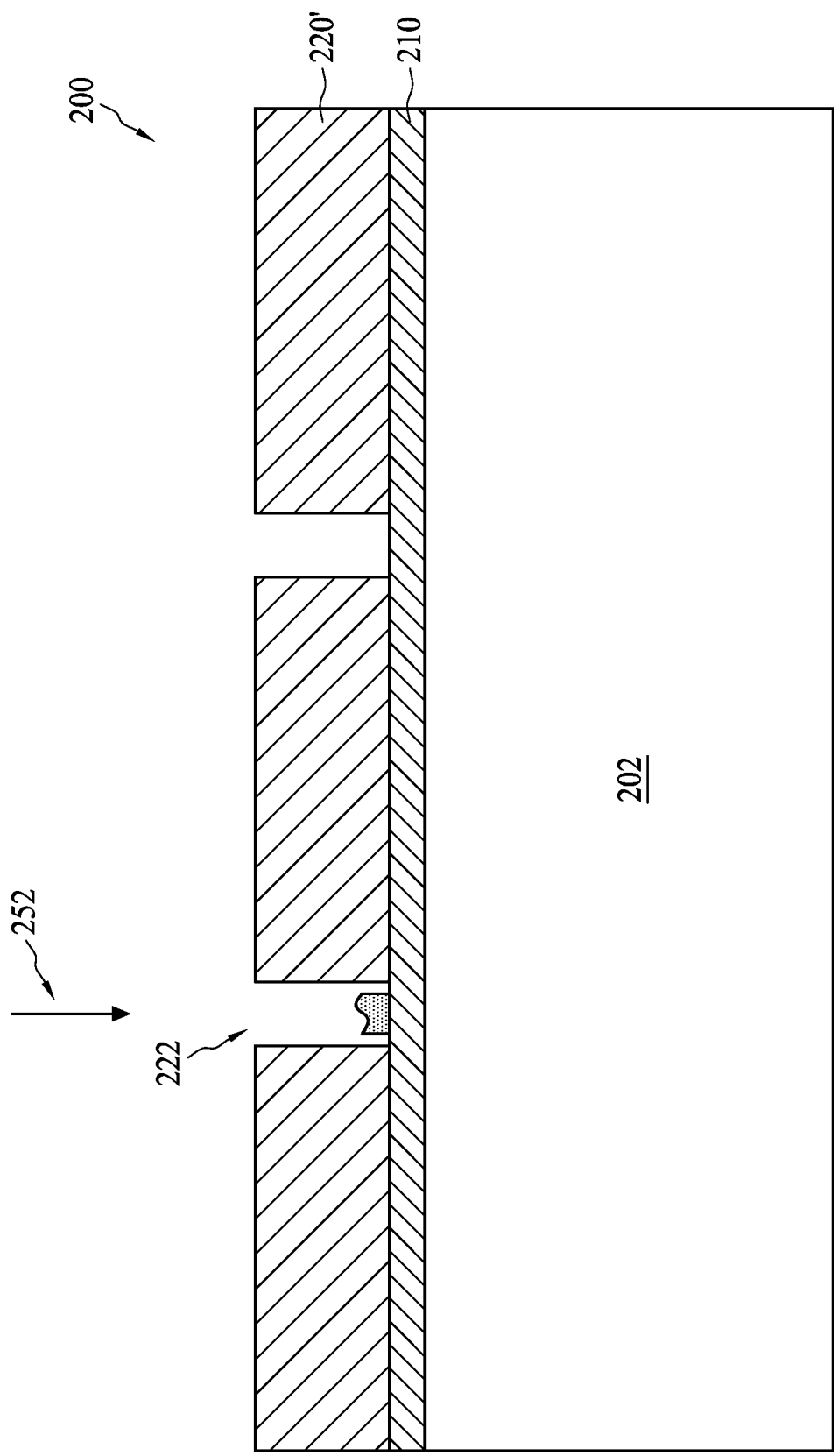

Referring to FIG. 3D, in some embodiments, after the removing of the portions of the shielding layer 220 by the etching 250, the patterned mask layer 230' is removed or stripped. In some embodiments, an after-strip inspection (ASI) and a quality assurance (QA) can be sequentially performed. In some embodiments, a repair 252 or a trimming can be performed if residue of the shielding layer 220 is found in the opening 222. The repair 252 or trimming is performed to remove the residue. In some embodiments, the repair 252 includes a laser beam etching, an ion beam etching, or an electron beam etching, but the disclosure is not limited thereto. More important, the repair 252 is performed with a halogen-based gas being involved. In some embodiments, the halogen-based gas includes, for example but not limited thereto, $Cl_2$, $F_2$, $CF_4$, $CCl_4$, HBr, HI, $CHF_3$, $SF_6$, $C_2F_6$, or HCl, etc. In some embodiments, fluorine-based gas is used in the repair 252, but the disclosure is not limited thereto. During the repair 252, the protecting layer 210 provides protection to the underlying mask substrate 202, and thus over-etching and surface roughness issues are both mitigated. In some embodiments, the repair 252 may be monitored by the OES sensor or by the BSE detector, as mentioned above.

Figure 3E:
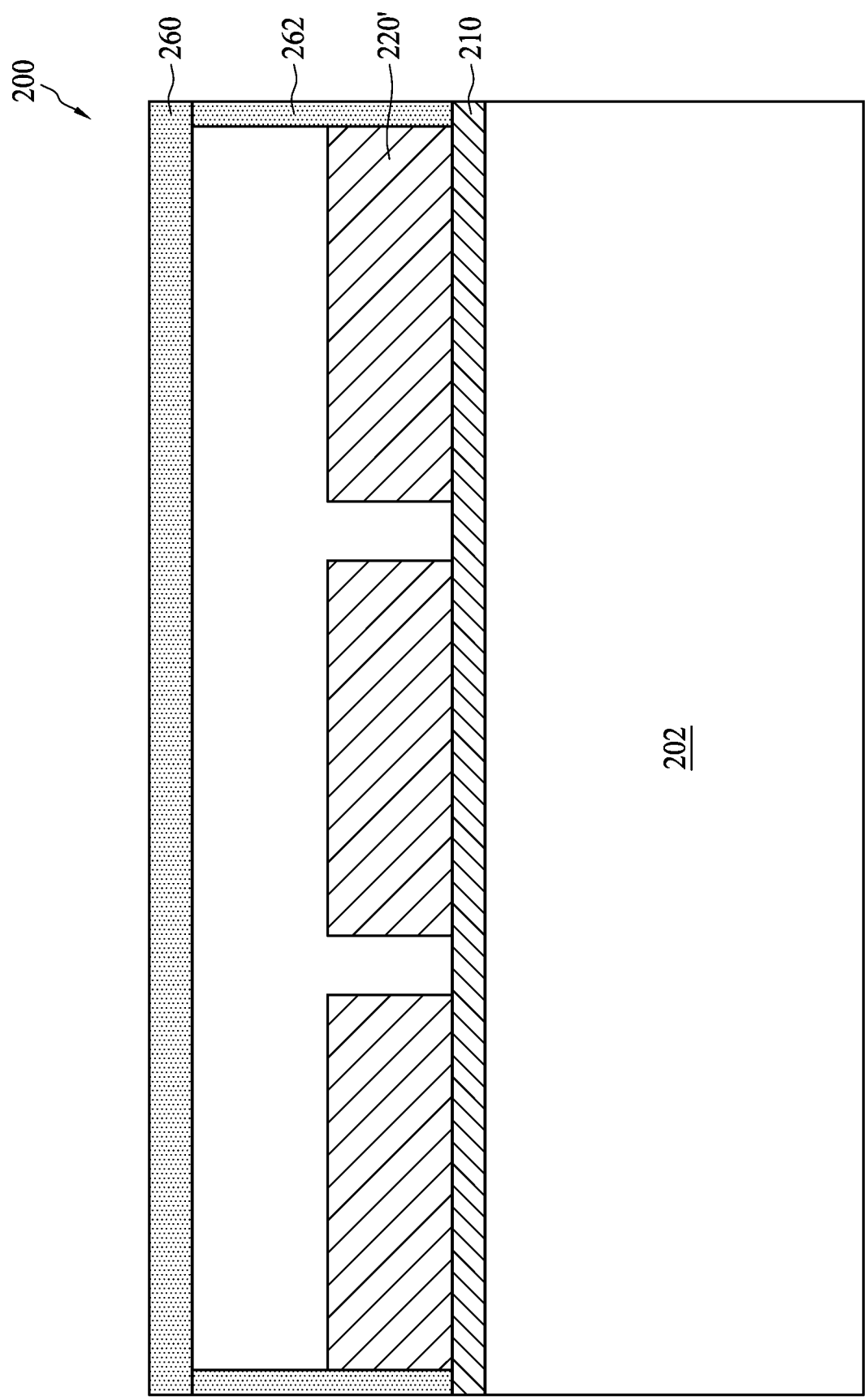

Referring to FIG. 3E, in some embodiments, a cleaning operation is performed and a pellicle 260 is then mounted on the mask substrate 202 to protect the patterned shielding layer 220' from contaminants. In some embodiments, the pellicle 260 may include a membrane made of a thin film that is transparent to radiation beams. In some embodiments, the pellicle 260 may be secured to a pellicle frame 262, which is made of a material with sufficient mechanical strength, such as aluminum, and which may be designed in a shape and dimension to properly secure the pellicle 260. An opposite side of the frame 262 is bonded to the mask substrate 202 with an adhesive. As a result, contaminants may fall onto the pellicle 260, rather than onto the patterned shielding layer 220', which is spaced from the deposited contaminants by a height of the pellicle frame 262. In a photolithography process, light is focused on the patterned shielding layer 220' and the contaminants have fallen onto the pellicle 260 are unlikely to affect the quality of patterns to be produced.

In some embodiments, the photomask 200 does not have a pellicle formed thereon because the pellicle may be disadvantageous for some embodiments of lithography including some embodiments using EUV radiation. For example, because of high absorption of the EUV by the pellicle, heat affects may be disadvantageous.

Still referring to FIG. 3E, accordingly, a photomask 200 is provided. The photomask 200 includes the mask substrate 202, the protecting layer 210 covering the entire surface of the mask substrate 202, the patterned shielding layer 220', and the pellicle 260. As shown in FIG. 3E, portions of the protecting layer 210 are exposed through the patterned shielding layer 220'. It should be noted that the protecting layer 210 is more resistant to the etchings 250 and 252 (shown in FIGS. 3C and 3D) having a halogen-based gas than the mask substrate 200 and the patterned shielding layer 220'. In some embodiments, the protecting layer 210 is fluorine radical-resistant. In some embodiments, the protecting layer 210 includes metal fluoride. Thus, during the forming of the photomask 200, the globalized over-etching defects, which may be caused by the etching 250 during the removing of the portions of the shielding layer 210, and the localized over-etching defects and surface roughness issue, which may be caused by the repair 252, are both mitigated. Further, since the difference between the BSE intensity of the shielding layer 220 and the BSE intensity of the protecting layer 210 is greater than 30%, a large difference in BSE intensities can be detected and the critical characteristics, such as the etching end point, can be automatically and successfully controlled. Consequently, flatness of the photomask 200 is improved.

In some embodiments, shorter wavelength light such as deep ultraviolet (DUV) including 248 nm UV, emitted by krypton fluoride (KrF) excimer lasers, and 193 nm UV, emitted by argon fluoride (ArF) excimer lasers, are employed to achieve patterning of integrated circuit features that are much smaller that IC features previously possible, such as those in ranges of 130 nm, 90 nm and 65 nm. It should be noted that the protecting layer 210 includes metal fluoride, which is suitable for use with various exposure equipment. For example, an application range of $MgF_2$ is between approximately 140 nm and approximately 230 nm, an application range of $AlF_3$ is approximately 193 nm, an application range of LaF3 is between approximately 130 nm and 193 nm, and an application range of GdF3 is approximately 193 nm. Accordingly, the protecting layer 210 can be used in the lithography exposure operation, such as the ultraviolet (UV) lithography technique, the abovementioned DUV lithography technique, or the extreme ultraviolet (EUV) lithography technique. In some embodiments, the photomask 200 can be used in operations utilizing an attenuated phase shift mask (APSM) and an opaque MoSi on glass (OMOG), which is used with wavelengths of about 157 nm, 193 nm, 248 nm, 365 nm or more.

Further, in some embodiments, the thickness of the protecting layer 210 can be between approximately 1 nm to approximately 1000 nm. It should be noted that if the thickness of the protecting layer 210 is less than 1 nm, the protecting layer 210 may not be able to provide sufficient protection to the underlying mask substrate 202. If the thickness of the protecting layer 210 is greater than 1000 nm, transmittance of the protecting layer 210 is less than 90, and the photomask may not be used. In some embodiments, the thickness of the protecting layer 210 is between approximately 1 nm and approximately 10 nm. It should be noted that if the thickness of the protecting layer 210 is greater than 10 nm, unwanted scattering may occur.

FIGS. 6A to 7E are schematic drawings illustrating a semiconductor structure at various fabrication stages constructed according to aspects of the present disclosure in one or more embodiments. Similar elements in FIGS. 3A to 3E and FIGS. 6A to 7F are designated by the same numerals, and include similar materials; therefore, descriptions of such redundant details are omitted in the interest of brevity. As shown in FIG. 6A, a substrate 300 is received. A photoresist layer 310 is formed over the substrate 300 according to operation 112. In some embodiments, the substrate 300 can include a semiconductor wafer such as a silicon wafer. In some embodiments, the substrate 300 can include a material layer (not shown) formed thereon, and the material layer can include a semiconductor material layer, a dielectric material layer such as an inter-layer dielectric (ILD) layer or an inter-metal dielectric (IMD) layer, or a conductive material layer such as a metal layer or a doped polysilicon layer in various embodiments, but the disclosure is not limited thereto. In some embodiments, a hard mask layer can be formed on the substrate 300 or the material layer, and the photoresist layer 310 is formed on the hard mask layer. In some embodiments, the photoresist layer 310 is formed over the substrate 300 by suitable technology such as spin-on coating.

Still referring to FIG. 6A, the photoresist layer 310 is exposed to an actinic radiation through the photomask 200 according to operation 114. The photomask 200 can include a mask substrate 202, a protecting layer 210 disposed on the mask substrate 202, a patterned shielding layer 220' disposed on the protecting layer 210, and a pellicle (not shown) disposed over the patterned shielding layer 220'. In some embodiments, the patterned shielding layer 220' can be formed by operations 102 to 108 of the method 100 (shown in FIG. 1), but the disclosure is not limited thereto. The photoresist layer 310 is sensitive to the actinic radiation beam during the exposing process and is resistant to a subsequent process (such as etching or ion implantation). In some embodiments, the photoresist layer 310 includes a polymeric material as a matrix that is resistant; a radiation-sensitive component (such as photo-acid generator or PAG); and solvent. The photoresist layer 310 may be positive tone resist or negative tone resist. During the exposing process, a chemical difference between the exposed portions 312 and non-exposed portions 314 are created, and the difference may be exploited by subsequent chemical development.

Figure 6B:
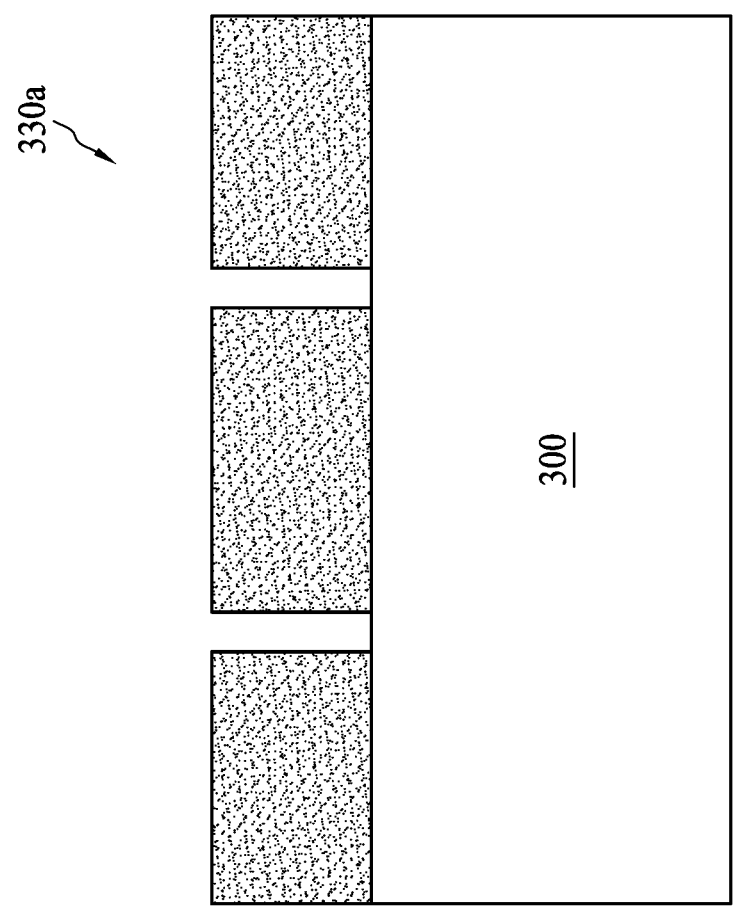

Referring to FIGS. 6B and 6C, the exposed photoresist layer 310 is developed to form a resist pattern 330a or 330b. In some embodiments, the exposed portions 312 of the positive tone resist are removed during the development process, and thus the resist pattern 330a is formed, as shown in FIG. 6B. In alternative embodiments, the non-exposed portions 314 of the negative tone resist are removed during the development process, and thus the resist pattern 330b is formed, as shown in FIG. 6C. The resist pattern 330a or 330b may be transferred to the substrate 300 or the material layer over the substrate 300 for forming semiconductor structure, and those details are omitted for brevity.

Figure 7A:
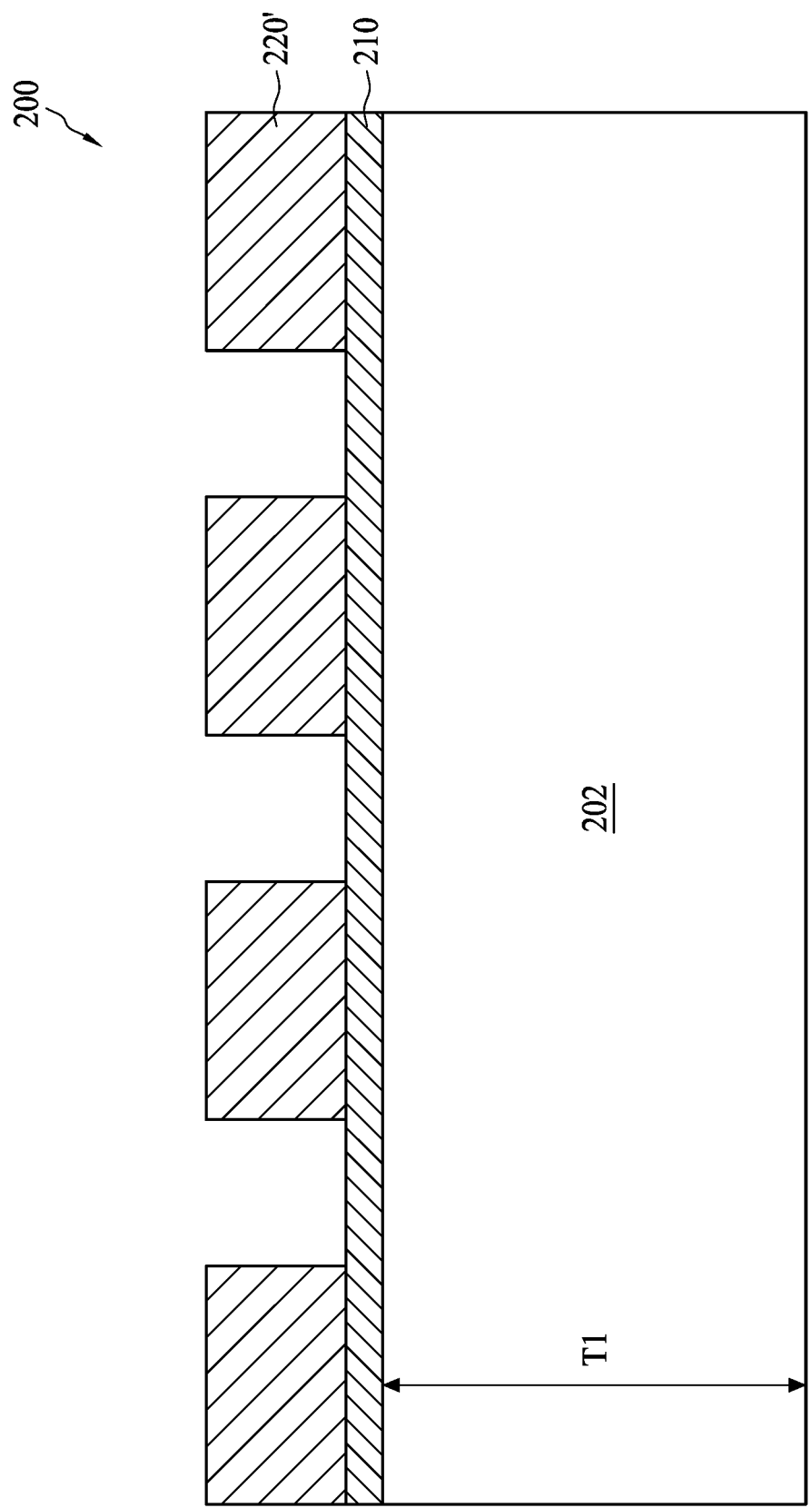

In some embodiments, the method for forming the semiconductor structure further includes recycling of the photomask 200. As shown in FIG. 7A, the photomask 200 is received according to operation 118 of the method 110. In some embodiments, the pellicle 260 can be removed so that the patterned shielding layer 220' and portions of the protecting layer 210 are exposed, as shown in FIG. 7A. In some embodiments, the mask substrate 202 includes a thickness T1, and the mask substrate 202 includes an improved thickness uniformity due to the protecting layer 210.

Figure 7B:
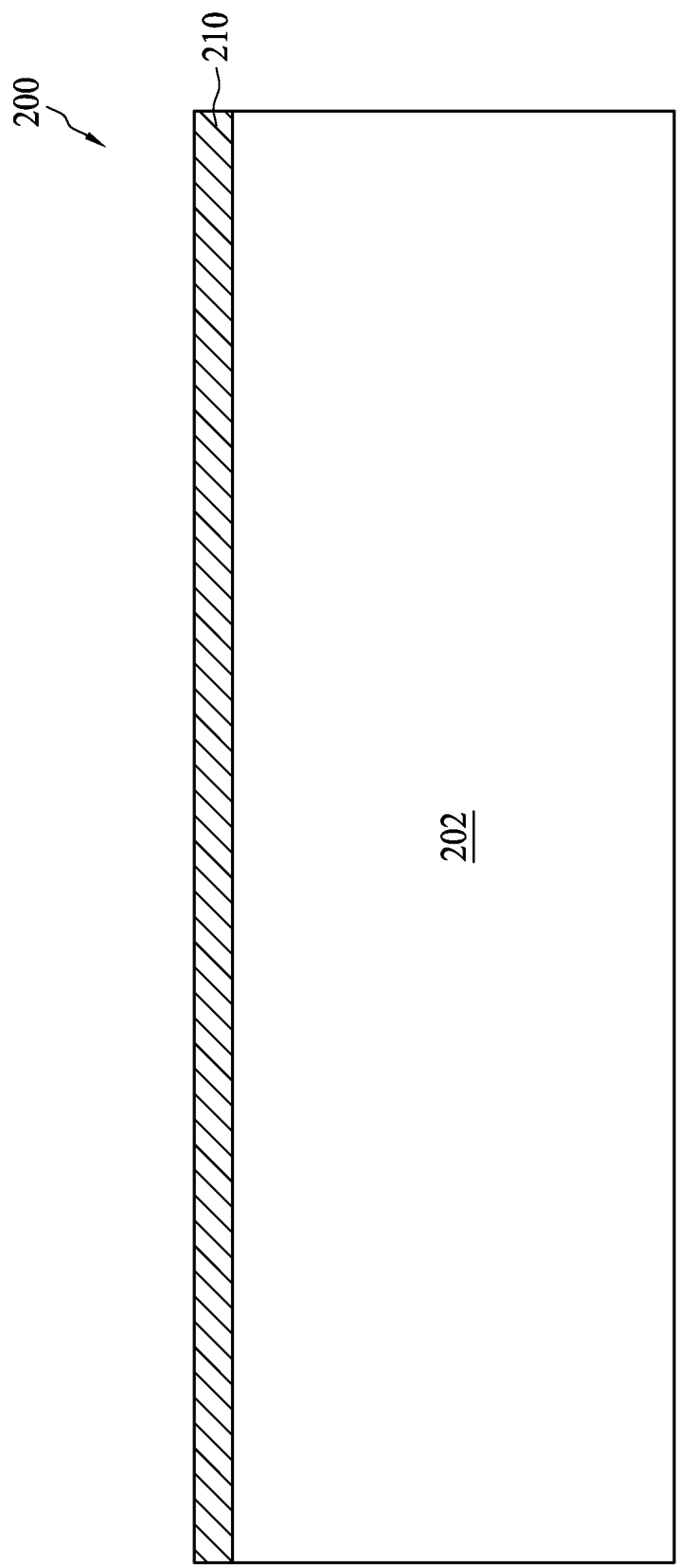

Referring to FIGS. 7A and 7B, the patterned shielding layer 220' is removed to expose the protecting layer 210 according to operation 118 of the method 110 (shown in FIG. 2). In some embodiments, the patterned shielding layer 220' is removed by a gas recycle operation is performed by a plasma using a halogen-based gas. In some embodiments, the gas recycle operation is performed with a fluorine-containing plasma. The protecting layer 210, which includes metal fluoride, is resistant to the fluorine radicals. Accordingly, the surface of the mask substrate 202 is protected by the protecting layer 210 and thus is impervious to the gas recycle operation. In some embodiments, the patterned shielding layer 220' is removed by a wet recycle operation or a wet etching which uses an etchant including potassium hydroxide (KOH), phosphoric acid ($H_3PO_4$), nitric acid ($HNO_3$), acetic acid ($CH_3COOH$) or a combination of ammonium cerium nitrate ($NH_4Ce(NO_3)_6$) and perchloric acid ($HClO_4$), but the disclosure is not limited thereto. In some embodiments, an etchant including $Ce(NH_4)_2(NO_3)_6$, $HClO_4$ and $H_2O$ can be used to remove the patterned shielding layer 220' having Cr-based material, but the disclosure is not limited thereto. In some embodiments, an etchant including $H_3PO_4$, $HNO_3$, $CH_3COOH$ and $H_2O$ can be used to remove the patterned shielding layer 220' having Mo-based material, but the disclosure is not limited thereto. It should be noted that the protecting layer 210 is resistant to the etchant used to remove the patterned shielding layer 220'. Accordingly, the surface of the mask substrate 202 is protected by the protecting layer 210 and thus is impervious to the wet recycle operation.

Referring to FIG. 7C, in some embodiments, the protecting layer 210 can be removed. In such embodiments, the protecting layer 210 is removed by an etchant including nitric acid ($HNO_3$), sulfuric acid ($H_2SO_4$), or phosphoric acid ($H_3PO_4$), but the disclosure is not limited thereto. In some embodiments, an etchant including phosphoric acid ($H_3PO_4$), nitric acid ($HNO_3$), acetic acid ($CH_3COOH$) and $H_2O$ is used. In some embodiments, the surface of the mask substrate 202 is exposed and the recycle of the mask substrate 202 is completed. In some embodiments, the mask substrate 202 includes a thickness T2 after the removing of the protecting layer 210, and the thickness T2 is the same as the thickness T1. The mask substrate 202 is then cleaned and can be reused.

It should be noted that in some embodiments, when the protecting layer 210 is omitted and portions of the mask substrate are exposed through the patterned shielding layer, thickness uniformity is reduced because the etching and repair for forming the patterned shielding layer consume the mask substrate. Further, a plurality of recesses with a rough bottom may be obtained. In such embodiments, an extra mask layer must be formed on the recesses before the removing of the patterned shielding layer. The extra mask layer is formed to protect the mask substrate from further consumption during the removing of the patterned shielding layer. The extra mask layer is then removed to expose the recesses after the removing of the patterned shielding layer. To remove the recesses and the rough bottom surface, a polishing operation is required in those embodiments. In some embodiments, portions of the mask substrate are removed to obtain a flat surface by the polishing operation and thus thickness of the mask substrate is reduced. The mask substrate is then cleaned and can be reused. In such embodiments, a final thickness after the recycling is less than the original thickness before the removing of the patterned shielding layer. It should be noted that a service life of the mask substrate is therefore reduced because the thickness is reduced every time the photomask undergoes the recycling.

It is concluded that without the protecting layer 210, the recycling of the photomask includes more than five operations and the mask substrate suffers from thickness reduction. In some embodiments, the protecting layer 210 including metal fluoride is provided such that the recycling of the photomask 200 includes less than five operations: the removing of the patterned shielding layer 220', the removing of the protecting layer 210 and the cleaning. In other words, the recycling of the photomask 200 is simplified and the process is shortened. Further, since the protecting layer 210 protects the entire surface of the mask substrate 202, surface flatness and thickness uniformity are improved, and surface roughness is reduced. That is, the forming of the protecting layer 210 leads to a polishing-free recycling. More importantly, the thickness T1 before the removing of the patterned shielding layer 220' and the thickness T2 after removing the protecting layer 210 are the same due to the polishing-free recycling. In other words, the thickness reduction is mitigated according to the embodiments, and thus the mask substrate obtains a longer service life.

Figure 7D:
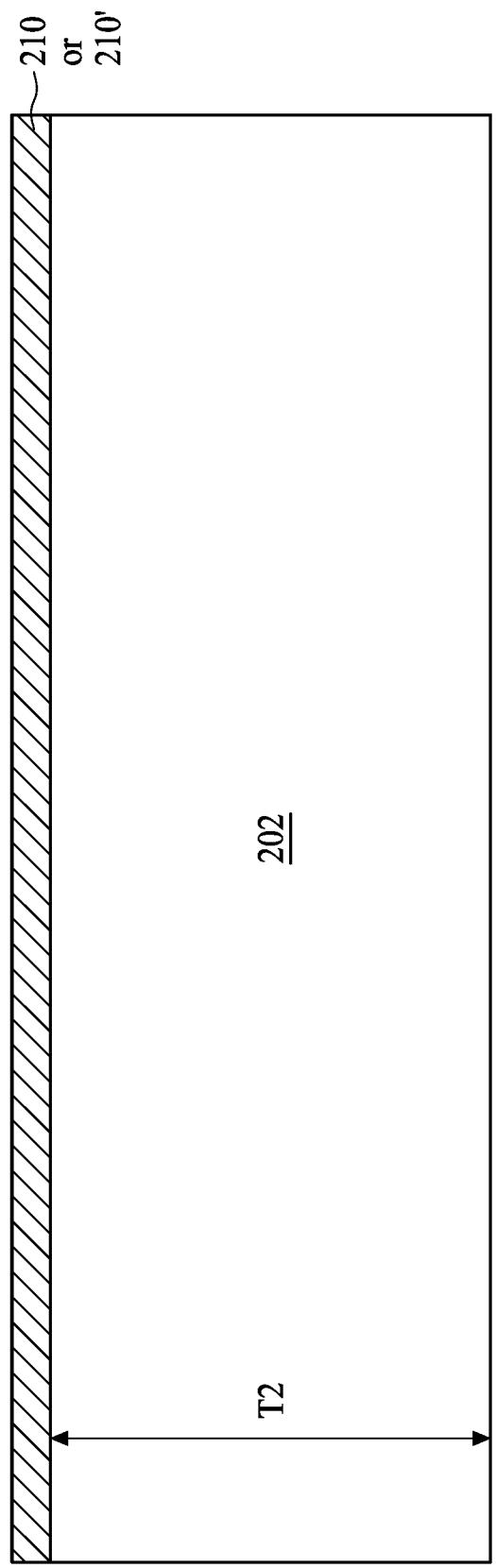

Referring to FIG. 7D, in some embodiments, the removing of the protecting layer 210 can be omitted, and thus the recycling of the photomask includes two operations: removing the patterned shielding layer 220' and the cleaning.

Still referring to FIG. 7D, in some embodiments, another protecting layer 210' can be formed on the mask substrate 202 after the cleaning. As mentioned above, the protecting layer 210' is formed to cover and protect the entire surface of the mask substrate 202. In some embodiments, the mask substrate 202 can be used after the forming of the protecting layer 210'.

Figure 7E:
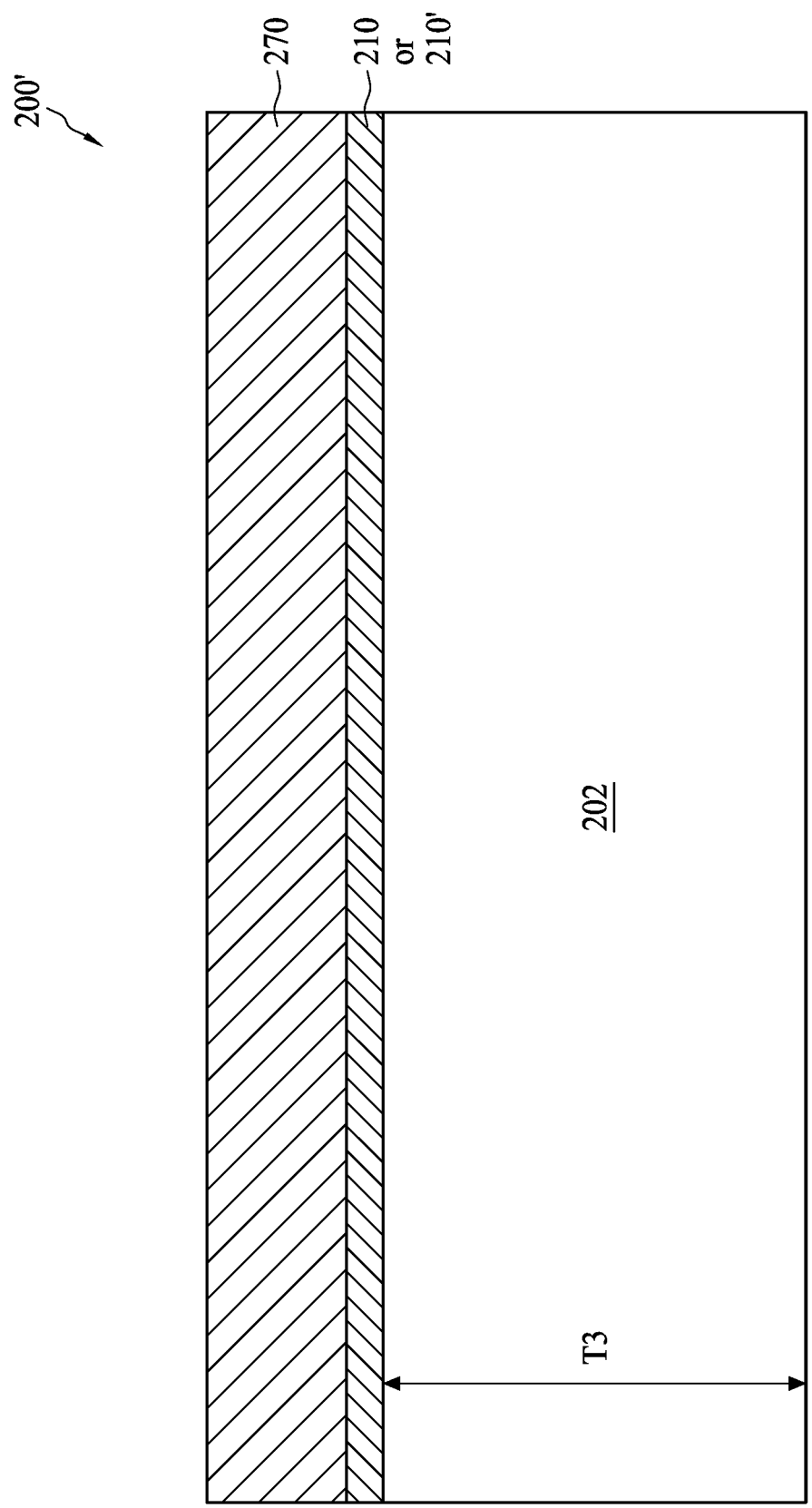

Referring to FIG. 7E, a material layer 270 is formed on the protecting layer 210 or 210'. In some embodiments, the material layer 270 can include material used to form the shielding layer, but the disclosure is not limited thereto. In some embodiments, the material layer 270 can be patterned by operations 104 to 108 of the method 100 (shown in FIG. 1), but the disclosure is not limited thereto. In some embodiments, another photomask 200' is obtained as shown in FIG. 7E. It should be noted that a thickness T3 of the mask substrate 202 after the forming of the material layer 222 is the same as the thickness T1 of the mask substrate 202 before the removing of the patterned shielding layer 220' (and the thickness T2 after the removing of the protecting layer 210).

The present disclosure therefore provides photomask, a method for forming a photomask and a method for treating a mask substrate. The protecting layer is formed on the mask substrate to provide protection to the mask substrate from globalized and localized defects. Accordingly, flatness of the mask substrate is improved. Further, since the globalized and localized defects are reduced, a polishing operation is no longer needed during the recycling of the mask substrate. In some embodiments, operations for forming the photomask and operations for recycling the mask substrate are both simplified. Accordingly, the mask substrate requires shorter process flow and incurs lower cost during the forming of the photomask and in the recycling. Further, the mask substrate features a longer service life because the thickness reduction is mitigated.

The present disclosure provides a photomask including a substrate, a first layer covering a surface of the substrate, and a patterned second layer on the first layer. In some embodiments, portions of the first layer are exposed through the patterned second layer. In some embodiments, the first layer is more resistant to a halogen-based gas than the substrate and the patterned second layer. In some embodiments, the first layer includes metal fluoride.

In some embodiments, a method for forming a photomask is provided. The method includes the following operations. A substrate is received, and a protecting layer and a shielding layer are formed on the substrate. Portions of the shielding layer are removed to form a patterned shielding layer. A BSE detector is provided to monitor the removing of the portions of the shielding layer. When a difference in BSE intensities obtained from the BSE detector is greater than approximately 30%, the removing of the portions of the shielding layer is stopped. The BSE intensity in following etching loops becomes stable.

In some embodiments, a method for forming a semiconductor structure is provided. The method includes the following operations. A photoresist layer is formed over a substrate. The photoresist layer is exposed with actinic radiation through a photomask by using an optical lithography tool. The exposed photoresist layer is removed to form a resist pattern. In some embodiments, the photomask includes a mask substrate, a patterned shielding layer and a protecting layer is received. The protecting layer is disposed between the mask substrate and the patterned shielding layer and covers a surface of the mask substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photomask, comprising:
   receiving a substrate wherein a protecting layer and a shielding layer are formed on the substrate;
   removing portions of the shielding layer to form a patterned shielding layer;
   providing a back scatter electron (BSE) detector to monitor the removing of the portions of the shielding layer; and
   stopping the removing of the portions of the shielding layer when a difference in BSE intensities obtained from the BSE detector is greater than approximately 30%, and the BSE intensity in following etching loops becomes stable.

2. The method of claim 1, wherein the removing of the portions of the shielding layer further comprises:
   forming a patterned mask layer on the shielding layer; and
   performing an etching to remove the portions of the shielding layer through the patterned mask layer to form the pattern.

3. The method of claim 2, wherein the etching comprises a laser beam etching or a plasma bombardment using a halogen-based gas.

4. The method of claim 2, wherein the removing of the portions of the shielding layer further comprises performing a repair having a halogen-based gas after the performing of the etching.

5. The method of claim 4, wherein the repair comprises a laser beam etching, an ion beam etching, or an electron beam etching.

6. The method of claim 1, wherein the protecting layer comprises metal fluoride.

7. The method of claim 1, wherein a thickness of the protecting layer is between approximately 1 nm and approximately 10 nm.

8. A method for forming a photomask, comprising:
   forming a first layer and a second layer on a substrate, wherein the second layer is separated from the substrate by the first layer, the first layer and the second layer comprise different materials, and the first layer comprises a metal fluoride;
   forming a patterned mask layer on the second layer;
   removing portions of the second layer to form a patterned second layer through the patterned mask layer;
   monitoring a back scatter electron (BSE) intensity during the removing of the portions of the second layer;
   stopping the removing of the portions of the second layer when a difference in BSE intensities is greater than approximately 30%; and
   forming a pellicle over the substrate, the first layer and the patterned second layer.

9. The method of claim 8, wherein the removing of the portion of the second layer comprises a laser beam etching or a plasma bombardment using a halogen-based gas.

10. The method of claim 8, wherein the second layer comprises chromium (Cr), chromium nitride (CrN), molybdenum-silicon-nitride (MoSiN), molybdenum silicide (MoSi), or molybdenum silicon oxynitride (MoSiON).

11. The method of claim 10, wherein the first layer comprises magnesium fluoride ($MgF_2$), aluminum fluoride ($AlF_3$), lanthanum fluoride ($LaF_3$), or gadolinium fluoride ($GdF_3$).

12. The method of claim 8, wherein the second layer comprises silicon nitride (SiN), silicon oxide (SiO) or silicon oxynitride (SiON).

13. The method of claim 12, wherein the first layer comprises $LaF_3$ or $GdF_3$.

14. The method of claim 8, wherein the removing of the portions of the shielding layer further comprises performing a repair having a halogen-based gas after the performing of the etching.

15. The method of claim 14, wherein the repair comprises a laser beam etching, an ion beam etching, or an electron beam etching.

16. A method for forming a photomask, comprising:
   forming a protecting layer and a shielding layer on a mask substrate, wherein the protecting layer is more resistant to the halogen-based gas than the mask substrate and the shielding layer;
   removing portions of the shielding layer to form a patterned shielding layer by a laser beam etching or a plasma bombardment using a halogen-based gas;
   monitoring a back scatter electron (BSE) intensity during the removing of the portions of the shielding layer; and
   stopping the removing of the portions of the shielding layer when a difference in BSE intensities is greater than approximately 30%.

17. The method of claim 16, wherein a thickness of the protecting layer is greater than 100 nanometers.

18. The method of claim 17, further comprising determining the thickness of the protecting layer according to an equation (1) and an equation (2), wherein the equation (1) and the equation (2) are:

$$T = (1 - R)e^{-4k\pi d/\lambda} \quad (1)$$

$$R = \frac{(n-1)^2 + k^2}{(n+1)^2 + k^2} \quad (2)$$

wherein T indicates the transmittance of the protecting layer, R indicates the reflectance of the protecting layer, n indicates the refractive index of the protecting layer, k indicates the extinction coefficient of the protecting layer, λ indicates a wavelength of a light used in an exposure, and d indicates the thickness of the protecting layer.

19. The method of claim 16, wherein a thickness of the protecting layer is between 1 nanometer and 100 nanometers.

20. The method of claim 19, further comprising determining the thickness of the protecting layer according to an equation (3) to an equation (5), wherein the equation (3) to the equation (5) are:

$$T = \frac{1}{\frac{1}{1-R} + \frac{1}{T_s} - 1} \quad (3)$$

$$R = \frac{\left[n_0\left(\cos\theta - \frac{1}{n}k_s\sin\theta\right) - n_s\cos\theta\right]^2 + \left[n_0\frac{n_s}{n}\sin\theta - n\sin\theta + k_s\cos\theta\right]^2}{\left[n_0\left(\cos\theta + \frac{1}{n}k_s\sin\theta\right) + n_s\cos\theta\right]^2 + \left[n_0\frac{n_s}{n}\sin\theta + n\sin\theta - k_s\cos\theta\right]^2} \quad (4)$$

$$\theta = \frac{2\pi}{\lambda}nd \quad (5)$$

wherein Ts indicates the transmittance of the mask substrate, T indicates the transmittance of the protecting layer, R indicates the reflectance of the protecting layer, n0 indicates the refractive index of medium used in an exposure, ns indicates the refractive index of the mask substrate, n indicates the refractive index of the protecting layer, ks indicates the extinction coefficient of the mask substrate, θ indicates an incident angle of a light used in the exposure, λ indicates a wavelength of the light used in the exposure, and d indicates the thickness of the protecting layer.

* * * * *